United States Patent
Blazic

(10) Patent No.: US 9,609,773 B2
(45) Date of Patent: Mar. 28, 2017

(54) ISOLATOR FOR AN ELECTRONIC DEVICE

(71) Applicant: Tyco Electronics Corporation, Berwyn, PA (US)

(72) Inventor: Ernest Steven Blazic, Agoura Hills, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 688 days.

(21) Appl. No.: 13/679,710

(22) Filed: Nov. 16, 2012

(65) Prior Publication Data
US 2014/0139979 A1 May 22, 2014

(51) Int. Cl.
H05K 7/00 (2006.01)
H05K 5/00 (2006.01)
H05K 7/02 (2006.01)

(52) U.S. Cl.
CPC .............. *H05K 7/02* (2013.01); *H05K 5/0073* (2013.01)

(58) Field of Classification Search
CPC .................................................. B62D 24/02
USPC ........................................ 361/679.01–679.31
See application file for complete search history.

(56) References Cited

U.S. PATENT DOCUMENTS

| | | | |
|---|---|---|---|
| 5,761,031 A * | 6/1998 | Ajmani .............. | G11B 33/1493 361/679.34 |
| 6,180,883 B1 | 1/2001 | Copeland | |
| 6,530,563 B1 * | 3/2003 | Miller et al. .................. | 267/136 |
| 2005/0073166 A1 * | 4/2005 | Snyder ......................... | 296/35.1 |
| 2006/0198110 A1 | 9/2006 | Hunkeler et al. | |
| 2010/0258989 A1 * | 10/2010 | Blazic ..................... | F16F 15/08 267/141.1 |
| 2011/0076462 A1 * | 3/2011 | Jette ........................ | B29C 33/68 428/193 |

FOREIGN PATENT DOCUMENTS

| | | |
|---|---|---|
| DE | 197 42 458 C1 | 11/1998 |
| DE | 10 2007 006177 A1 | 8/2008 |
| DE | 10 2008 002160 A1 | 12/2009 |

OTHER PUBLICATIONS

International Search Report, International Application No. PCT/US/2013/070047, International Filing Date, Nov. 14, 2013.

* cited by examiner

*Primary Examiner* — Jerry Wu

(57) ABSTRACT

An electronic device assembly includes an electronic device having a mount that includes a mounting opening. The mounting opening is configured to receive mounting hardware therein for mounting the electronic device to a structure. An isolator is coupled to the mount. The isolator includes an elastomeric bushing configured to attenuate at least one of shock or vibration exerted on the electronic device. The isolator is incorporated within the mount such that the elastomeric bushing is received into the mounting opening of the mount.

17 Claims, 5 Drawing Sheets

ISOLATOR FOR AN ELECTRONIC DEVICE

BACKGROUND OF THE INVENTION

The subject matter described and/or illustrated herein relates generally to isolators for attenuating shock and/or vibration exerted on electronic devices.

Shock and/or vibration can lead to significant problems for electronic devices, such as damage, increased wear, malfunction, and/or outright failure. For example, shock and/or vibrational forces may cause an electromechanical device (e.g., an electromechanical relay) that is normally closed to unintentionally open, or vice versa. Moreover, and for example, shock and/or vibrational forces experienced by an electronic device may fracture and/or otherwise compromise the mechanical integrity of one or more components of the device, such as a circuit board, a contactor, etc. Such damage may cause the electronic device to malfunction or may cause failure of the device to operate. Repeated exposure to shock and/or vibrational forces may increase the wear rate of one or more components of an electronic device. For example, the contactors of an electromechanical device may wear at an increased rate when repeatedly subjected to shock and/or vibrational forces. Chatter experienced by components such as current carrying contacts and/or auxiliary position sensors of electromechanical devices is another example of increased wear that may be caused by shock and/or vibration. Such increased wear may compromise the performance of the electronic device.

Isolators are known for attenuating shock and/or vibration forces experienced by objects. But, the form factor and/or cost of known isolators may be prohibitive for use with at least some types of electronic devices. For example, known isolators increase the height of electronic devices, which prevent an assembly of the electronic device and the isolator from being used within a relatively confined space.

BRIEF DESCRIPTION OF THE INVENTION

In one embodiment, an electronic device assembly includes an electronic device having a mount that includes a mounting opening. The mounting opening is configured to receive mounting hardware therein for mounting the electronic device to a structure. An isolator is coupled to the mount. The isolator includes an elastomeric bushing configured to attenuate at least one of shock or vibration exerted on the electronic device. The isolator is incorporated within the mount such that the elastomeric bushing is received into the mounting opening of the mount.

In another embodiment, an isolator is provided for an electronic device having a mount for mounting the electronic device to a structure. The isolator includes a bobbin and an elastomeric bushing mounted on the bobbin such that the elastomeric bushing extends around the bobbin. The elastomeric bushing is configured to be engaged with the mount of the electronic device such that the elastomeric bushing is configured to attenuate at least one of shock or vibration exerted on the electronic device. The elastomeric bushing comprises Viton®.

In another embodiment, an isolator is provided for an electronic device having a mount for mounting the electronic device to a structure. The isolator includes a bobbin extending from an end to an opposite end. The isolator also includes an elastomeric bushing mounted on the bobbin such that the elastomeric bushing extends around the bobbin. The elastomeric bushing is configured to be engaged with the mount of the electronic device such that the elastomeric bushing is configured to attenuate at least one of shock or vibration exerted on the electronic device. The elastomeric bushing is compressed between the ends of the bobbin such that the elastomeric bobbin is preloaded. The natural frequency of the elastomeric bushing is tuned by selecting the amount of preload of the elastomeric bobbin.

DETAILED DESCRIPTION OF THE INVENTION

Figure 1:
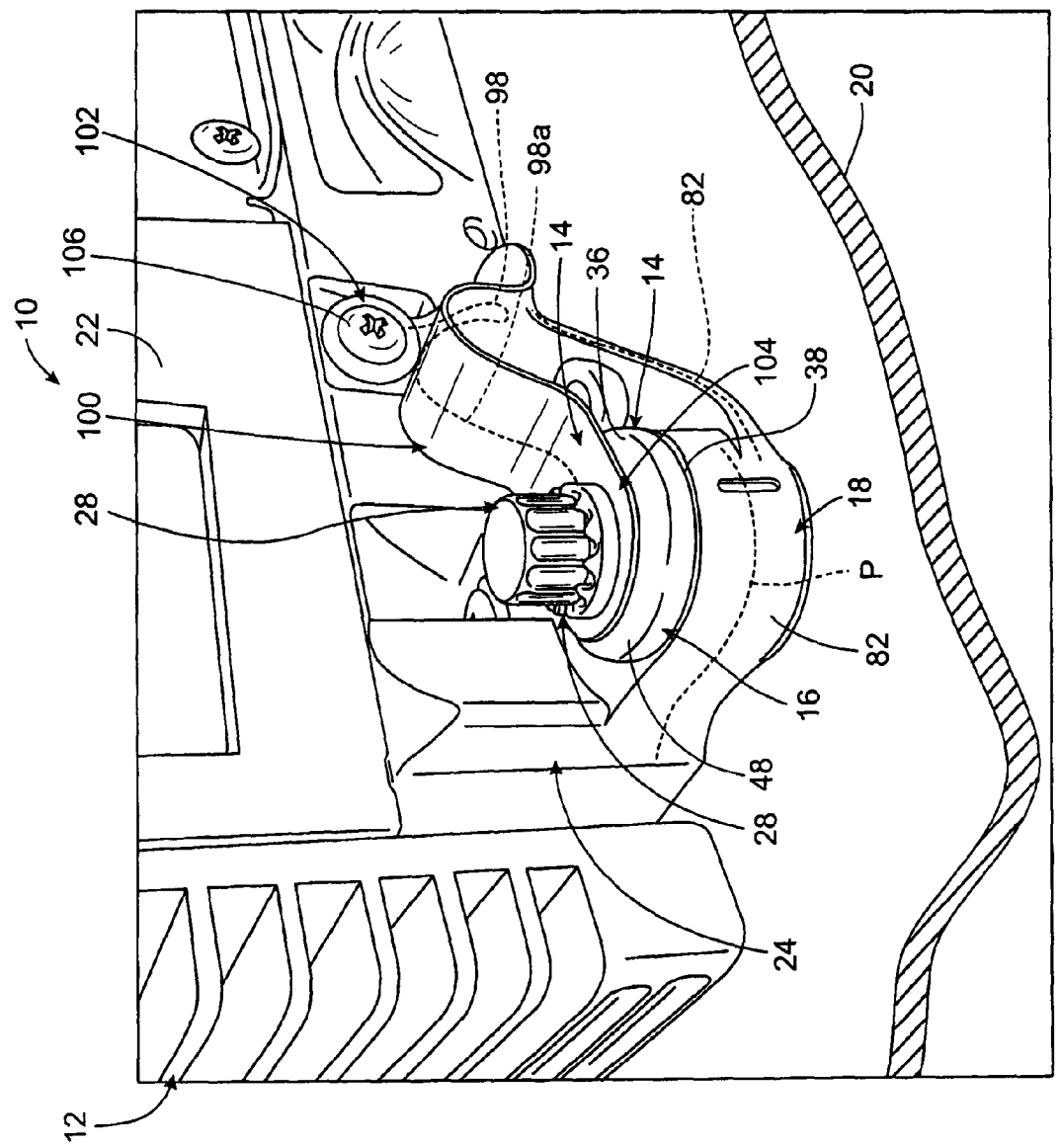
FIG. 1 is a perspective view of an exemplary embodiment of an electronic device assembly.

FIG. 1 is a perspective view of an exemplary embodiment of an electronic device assembly 10. The electronic device assembly 10 includes an electronic device 12 and one or more isolation systems 14. Each isolation system 14 includes an isolator 16 that is coupled to the electronic device 12 for attenuating shock and/or vibration exerted on the electronic device 12. As will be described in more detail below, the isolator 16 may be incorporated within a mount 18 of the electronic device 12. The isolator 16 may provide a segment of an electrical path between the electronic device 12 and a structure 20 to which the electronic device 12 is mounted, as will also be described in more detail below.

The electronic device 12 includes one or more electronic sub-devices 22. In the exemplary embodiment, the electronic device 12 is comprised of a plurality of electronic sub-devices 22. Alternatively, the electronic device 12 is comprised of a single electronic sub-device 22. Each electronic sub-device 22 may be any type of electronic device, such as, but not limited to, electromechanical devices (e.g., electromechanical relays, electromechanical switches, electromechanical contactors, and/or the like), electrochemical devices (e.g., battery chargers and/or the like), electrohydraulic devices, electrical connectors, circuit boards, circuit card assemblies, and/or the like. When comprised of a plurality of electronic sub-devices 22, each electronic sub-device 22 may be the same type of electronic device or two or more different types of electronic sub-devices 22 may be provided. The electronic device 12 may be used in any application(s), such as, but not limited to, electrical power supply and/or switching, radar, electrical charging, navigation systems, weapons, vehicles, electrical signal supply and/or switching, and/or the like.

The structure 20 to which the electronic device 12 is mounted may be any type of structure, such as, but not limited to, an airframe or other structure onboard an aircraft, a structure onboard another type of vehicle, an object carried by a living creature, a stationary (i.e., non-mobile) platform, a weapon (e.g., firearms that can be carried by a living creature, artillery pieces, cannon, relatively large machine guns and/or other guns that cannot be carried by a living creature, and/or the like), and/or the like. When mounted to the structure 20, shock and/or vibrational forces may be exerted on the electronic device 12. The isolation systems 14 are each configured to attenuate such shock and/or vibrational forces exerted on the electronic device 12.

Figure 2:
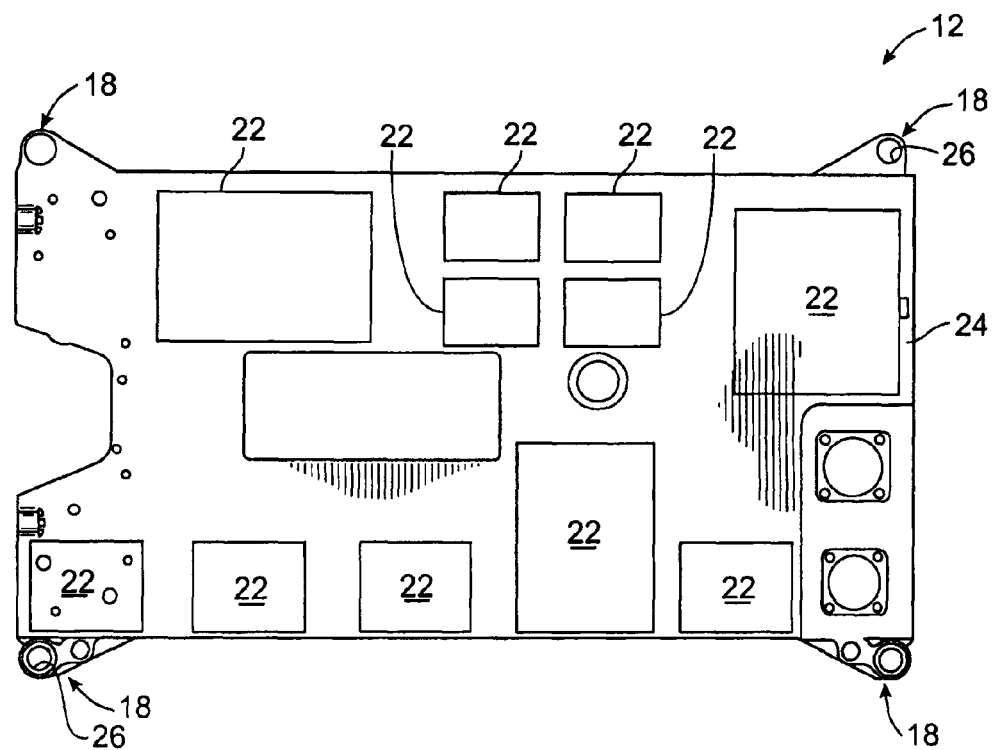
FIG. 2 is a plan view of an exemplary embodiment of an electronic device of the electronic device assembly shown in FIG. 1.

As briefly described above, the electronic device 12 includes the mount 18 for mounting the electronic device 12 to the structure 20. FIG. 2 is a plan view of an exemplary embodiment of the electronic device 12. In the exemplary embodiment, the electronic device 12 includes a chassis 24 that includes the mount 18. Specifically, the chassis 24 includes four mounts 18. Each mount 18 includes a mounting opening 26 that is configured to receive mounting hardware 28 (shown in FIGS. 1 and 7) for mounting the electronic device 12 to the structure 20 (shown in FIGS. 1 and 7). The mounting hardware 28 has been removed from the electronic device 12 in FIG. 2 to better illustrate the mounts 18. Although shown in FIG. 1 as being a threaded bolt, the mounting hardware 28 may include any type of mounting hardware that is capable of mounting the electronic device 12 to the structure 20, such as, but not limited to, a rivet, another type of threaded fastener, and/or the like. Moreover, each mount 18 may have any structure, size, shape, geometry, and/or the like, such as, but not limited to, the three-point mount shown herein and/or the like.

The chassis 24 is optionally electrically conductive. In the exemplary embodiment, the chassis 24 is shared between the plurality of electronic sub-devices 22. In other words, each of the electronic sub-devices 22 is mounted to and held by the chassis 24. Alternatively the chassis 24 is a dedicated chassis for a single electronic sub-device 22 (such that no other electronic sub-devices 22 are mounted thereto) or the electronic device 12 does not include the chassis 24. Moreover, the mounts 18 of the electronic device 12 are not limited to being located on the chassis 24. Rather, each mount 18 of the electronic device 12 may be located on any other component of the electronic device 12, such as, but not limited to, a housing, a cover, a substrate of a printed circuit, and/or another component of an electronic sub-device 22. Although four are shown, the electronic device 12 may include any number of the mounts 18.

Figure 3:
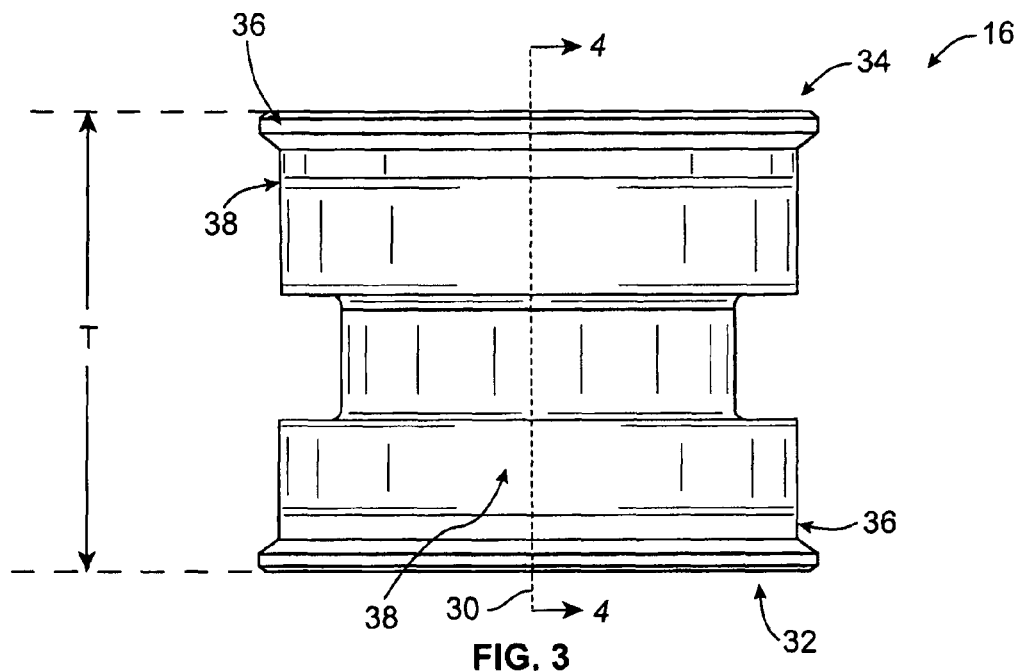
FIG. 3 is a perspective view of an exemplary embodiment of an isolator of the electronic device assembly shown in FIG. 1.
Figure 6:
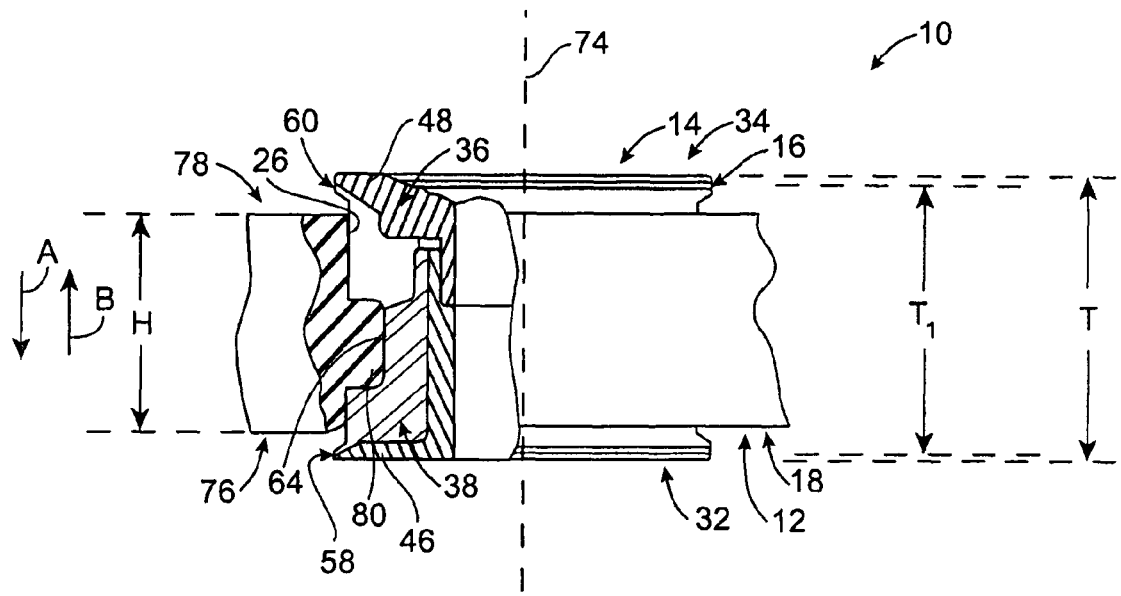
FIG. 6 is a partially broken-away elevational view of the electronic device assembly shown in FIG. 1 illustrating a cross section of the isolator shown in FIGS. 3-5 installed within a mount of the electronic device shown in FIG. 2.
Figure 7:
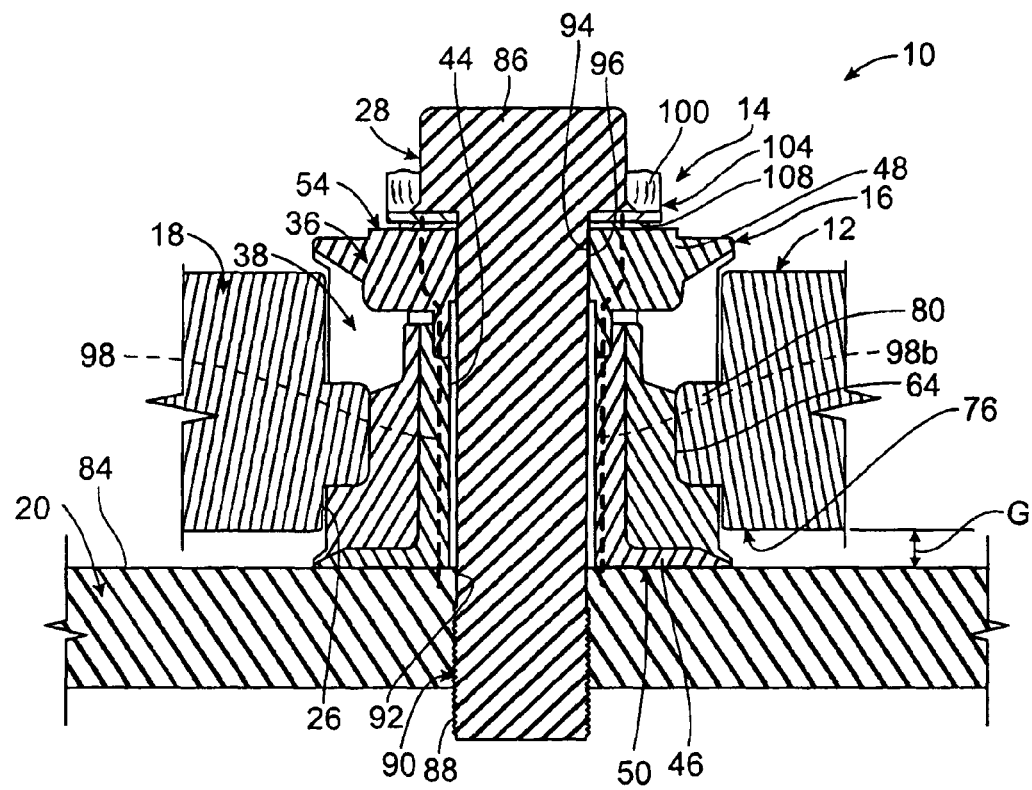
FIG. 7 is a cross-sectional view of the electronic device assembly shown in FIG. 1.

FIG. 3 is a perspective view of an exemplary embodiment of an isolator 16. The isolator 16 extends a thickness T along a central axis 30 from a structure end 32 to an opposite end 34. The isolator 16 includes a central bobbin 36 and an elastomeric bushing 38. The elastomeric bushing 38 is configured to attenuate shock and/or vibration exerted on the electronic device 12 (FIGS. 1, 2, 6, and 7). As will be described in more detail below, the elastomeric bushing 38 may be incorporated within the mount 18 (FIGS. 1, 2, 6, and 7) of the electronic device 12 by being received into the mounting opening 26 (FIGS. 2, 6, and 7). Although shown as having the general shape of a cylinder, the isolator 16 may include any other shape.

Figure 4:
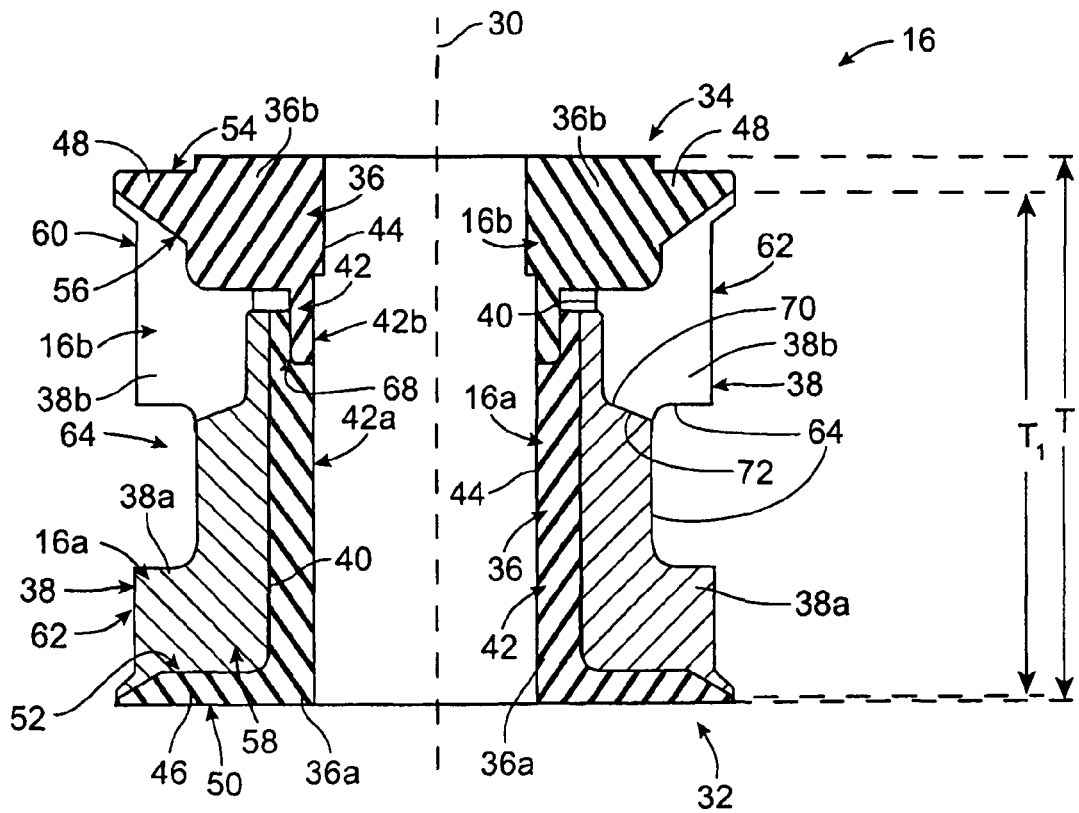
FIG. 4 is a cross-sectional view of the isolator shown in FIG. 3 taken along line 4-4 of FIG. 3.

FIG. 4 is a cross-sectional view of the isolator 16 taken along line 4-4 of FIG. 3. The elastomeric bushing 38 is mounted to the bobbin 36 such that the elastomeric bushing 38 extends around the bobbin 36. Specifically, the elastomeric bushing 38 includes a central opening 40 that extends through the elastomeric bushing 38 along the central axis 30. The bobbin 36 includes a central shaft 42 that is received into the central opening 40 of the elastomeric bushing 38 such that the elastomeric bushing 38 extends around the central shaft 42 of the bobbin 36.

The bobbin 36 extends along the central axis 30 (i.e., along the thickness T) of the isolator 16 from the structure end 32 to the opposite end 34. The bobbin 36 includes a central opening 44 that extends through the bobbin 36 along the central axis 30. The central opening 44 of the bobbin 36 is configured to receive the mounting hardware 28 (shown in FIGS. 1 and 7) for mounting the electronic device 12 (shown in FIGS. 1, 2, 6, and 7) to the structure 20 (shown in FIGS. 1 and 7). The bobbin 36 includes flanges 46 and 48 that extend radially outward from the central shaft 42 at the ends 32 and 34, respectively. The flange 46 includes a structure side 50 that is configured to face the structure 20 when the electronic device 12 is mounted to the structure 20. The flange 44 includes an elastomer side 52 that is opposite the structure side 50. The flange 48 includes a side 54 and an opposite elastomer side 56.

The elastomeric bushing 38 extends a thickness $T_1$ along the central axis 30 from the structure end 32 to the opposite end 34 of the isolator 16. As described above, the elastomeric bushing 38 extends around the central shaft 42 of the bobbin 36. Although shown as extending continuously around the central shaft 42 of the bobbin 36, the elastomeric bushing 38 is not limited thereto. Rather, the elastomeric bushing 38 may extend around the central shaft 42 discontinuously along one or more segments of the thickness $T_1$ of the elastomeric bushing 38 (e.g, foamed by openings, cavities, and/or the like within the elastomeric bushing 38). Such discontinuous segments may be used to tune the natural frequency of the elastomeric bushing 38. An end 58 of the elastomeric bushing 38 extends over the elastomer side 52 of the flange 46 of the bobbin 36. An opposite end 60 of the elastomeric bushing 38 extends over the elastomer side 56 of the bobbin flange 48. The thickness $T_1$ of the elastomeric bushing 38 is thus captured between the flanges 46 and 48 of the bobbin 36. Optionally, the elastomeric bushing 38 is bonded to the bobbin 36 and/or the mount 18 using a bonding agent (not shown) in addition or alternatively to being captured between the flanges 46 and 48.

The elastomeric bushing 38 includes an exterior side 62 that defines a radial (relative to the central axis 30) outer periphery of the elastomeric bushing 38. A groove 64 extends into the exterior side 62. Specifically, the groove 64 extends into the exterior side 62 radially inward relative to the central axis 30. In the exemplary embodiment, the groove 64 extends along the exterior side 62 along a continuous path that extends approximately perpendicular to the central axis 30 and generally follows the shape of the outer periphery of the exterior side 62. As will be described below, the groove 64 is configured to receive a flange 80 (shown in FIGS. 6 and 7) of the mounting opening 26 (shown in FIGS. 2, 6, and 7) of the electronic device mount 18 (shown in FIGS. 1, 2, 6, and 7) therein when the elastomeric bushing 38 is received within the mounting opening 26. The groove 64 is not limited to the path, shape, and/or the like shown and/or described herein, but rather may additionally or alternatively include other paths, shapes, and/or the like. The path, shape, and/or the like of the groove 64 may be selected to be complementary with the path, shape, and/or the like of the flange 80.

Figure 5:
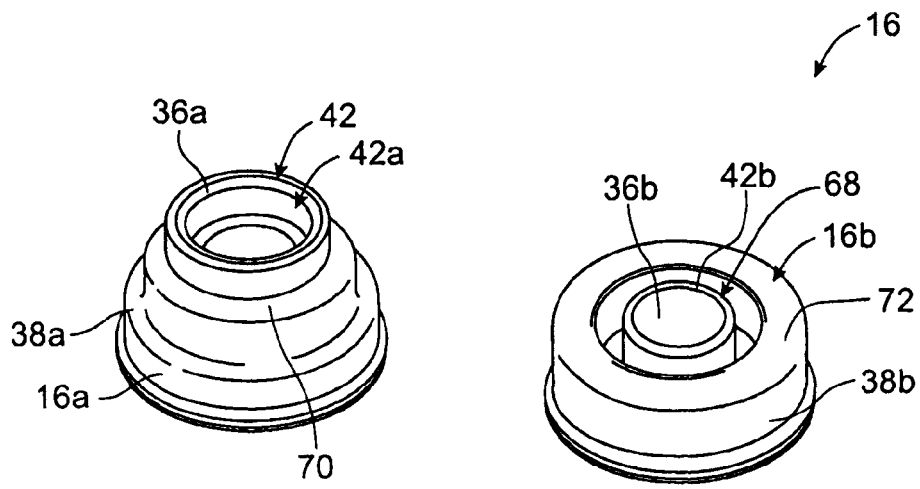
FIG. 5 is a partially exploded perspective view of the isolator shown in FIGS. 3 and 4 illustrating an exemplary embodiment of discrete isolator segments of the isolator.

As can be seen in FIG. 4, in the exemplary embodiment, the isolator 16 is defined by two discrete isolator segments 16a and 16b that are coupled together to define the isolator 16. FIG. 5 is a partially exploded perspective view of the isolator 16 illustrating the isolator segments 16a and 16b. Referring now to FIGS. 4 and 5, the elastomeric bushing 38 includes elastomeric members 38a and 38b that are discrete from each other, and the bobbin 36 includes bobbin members 36a and 36b that are discrete from each other. The isolator segment 16a includes the bobbin member 36a and the elastomeric member 38a, while the isolator segment 16a includes the bobbin member 36b and the elastomeric member 38b. The bobbin members 36a and 36b may each be referred to herein as a "first" and/or a "second" bobbin member. The elastomeric members 38a and 38b may each be referred to herein as a "first" and/or a "second" elastomeric member.

The bobbin members 36a and 36b mechanically couple together to couple the isolator segments 16a and 16b together. For example, the central shaft 42 of the bobbin 36 is defined by a shaft segment 42a of the bobbin segment 36a and a shaft segment 42b of the bobbin segment 36b. As best seen in FIG. 4, the shaft segment 42a receives an end 68 of the shaft segment 42b therein to facilitate coupling the bobbin segments 36a and 36b together. In the exemplary embodiment, the shaft segment 42b is received within the shaft segment 42a with a press-fit to couple the bobbin segments 36a and 36b together. But, in addition or alternative to the press-fit and/or reception of the shaft segment 42b within the shaft segment 42a, the shaft segments 42a and 42b may be coupled together using any coupling structure, arrangement, method, means, and/or the like, such as, but not limited to, using interlocking threads, a bonding agent (e.g., an adhesive), and/or the like. For example, in some other embodiments, the shaft segment 42a includes an internal thread that interlocks with an exterior thread of the shaft segment 42b when the shaft segment 42b is received within the shaft segment 42a. Moreover, and for example, an exterior surface of the shaft segment 42b may be bonded with an interior surface of the shaft segment 42a when the shaft segment 42b is received within the shaft segment 42a. Further, in some embodiments, in addition or alternatively to the couplings described above, the isolator segments 16a and 16b are coupled together solely by being captured between the mounting hardware 28 and the structure 20.

The coupling of the bobbin segments 36a and 36b couples the isolator segments 16a and 16b together. When the bobbin segments 36a and 36b of the bobbin 36 are coupled together, the elastomeric segments 38a and 38b of the elastomeric bushing 38 are engaged with each other. In the exemplary embodiment, an surface 70 of the elastomeric segment 38a abuts an surface 72 of the elastomeric segment 38b.

Although shown and described as being comprised of two discrete isolator segments 16a and 16b that couple together to define the isolator 16, it should be understood that the structure of the isolator shown and/or described herein is meant as exemplary only. For example, in other embodiments, the isolator 16 may be defined by a single segment or may be defined by a greater number of segments than two (e.g., a stack of three or more elastomeric segments).

The bobbin 36 may be fabricated from any material(s), such as, but not limited to, metal, plastic, and/or the like. Examples of suitable metals from which the bobbin 36 may be fabricated include, but are not limited to, steel, iron, stainless steel, copper, aluminum, and/or the like. The material(s), size, shape, geometry, and/or the like of the bobbin 36 may be selected such that the isolator 16, in cooperation with the mount 18, is configured to support a predetermined amount of weight, such as, but not limited to, a weight of at least approximately two pounds, a weight of at least approximately three pounds, a weight of at least approximately seven pounds, and/or the like.

The material(s) of the bobbin 36 may be selected such that the bobbin 36 is electrically conductive for providing an electrical path along the thickness T (shown in FIG. 3) of the isolator 16. In embodiments wherein the bobbin 36 is electrically conductive and is defined by the discrete bobbin segments 36a and 36b, the mechanical coupling between the bobbin segments 36a and 36b described above may maintain the electrical path (in addition or alternative to bobbin segments 36a and 36b being electrically connected at one or more other locations). In other words, in such embodiments, the bobbin segments 36a and 36b may be electrically connected together at the location(s) where the bobbin segments 36a and 36b are mechanically coupled together. For example, in embodiments wherein the shaft segments 42a and 42b are coupled together using a press-fit between the shaft segments 42a and 42b, the bobbin segments 36a and 36b may be electrically connected together where the shaft segments 42a and 42b engage each other with the press-fit. Moreover, and for example, in embodiments wherein the shaft segments 42a and 42b are coupled together using a bonding agent, the bonding agent may be electrically conductive.

The elastomeric bushing 38 may be fabricated from any material(s), such as, but not limited to, silicone, rubber, a fluoropolymer elastomer, Viton®, and/or the like. The elastomeric bushing 38 may be fabricated from any grade of Viton®, such as, but not limited to, grade A, grade B, grade F, GLT, GBLT, GFLT, Viton® Extreme, and/or the like. Examples of suitable rubbers from which the elastomeric bushing 38 may be fabricated include, but are not limited to, natural rubber, synthetic rubber, black rubber, butyl rubber, ethylene propylene diene monomer (EPDM) rubber, and/or the like. The material(s), size, shape, geometry, and/or the like of the elastomeric bushing 38 may be selected such that the isolator 16, in cooperation with the mount 18, is configured to support a predetermined amount of weight, such as, but not limited to, a weight of at least approximately two pounds, a weight of at least approximately three pounds, a weight of at least approximately seven pounds, and/or the like.

The material(s), size, shape, geometry, preload, and/or the like of the elastomeric bushing 38 may be selected such that the elastomeric bushing 38 has a predetermined natural frequency, such as, but not limited to, between approximately 75 Hz and approximately 115 Hz, between approximately 85 Hz and approximately 105 Hz, between approximately 80 Hz and approximately 100 Hz, approximately 100 Hz, and/or the like. For example, in embodiments wherein the elastomeric bushing 38 is fabricated from Viton®, the size of the elastomeric bushing 38 may be selected such that when the elastomeric bushing 38 is mounted between the electronic device 12 (shown in FIGS. 1, 2, 6, and 7) and the structure 20 (shown in FIGS. 1 and 7) as described and/or illustrated herein, the elastomeric bushing 38 has a predetermined amount of preload that provides the elastomeric bushing 38 with a predetermined natural frequency. The natural frequency of the elastomeric bushing 38 may have any value. Selection of the natural frequency of the elastomeric bushing 38 may depend on the environment of the electronic device 12, any natural frequencies of the electronic device 12 susceptible to being damaged, and/or the like. The natural frequency of the elastomeric bushing 38 may be selected (i.e., tuned) such that the elastomeric bushing 38 is configured to attenuate frequencies at and/or greater than a predetermined value, such as, but not limited to, at least approximately 140 Hz, at least approximately 250 Hz, at least approximately 300 Hz, at least approximately 500 Hz, at least approximately 800 Hz, and/or the like. For example, in some embodiments, the elastomeric bushing 38 is configured to attenuate each of the frequencies of 250 Hz, 500 Hz, and 800 Hz.

FIG. 6 is a partially broken away elevational view of the electronic device assembly 10 illustrating a cross section of an isolator 16 of an isolation system 14 installed within a mount 18 of the electronic device 12. The mount 18 of the electronic device 12 extends a height H along a central axis 74 from a mounting side 76 to an opposite side 78. As can be seen in FIG. 6, the mounting opening 26 extends through the height H of the mount 18 such that the height H can also be considered the height H of the mounting opening 26. The mounting side 76 of the mount 18 faces the structure 20 (shown in FIGS. 1 and 7) when the electronic device 12 is mounted to the structure 20. The mount 18 includes an interior flange 80 that extends radially inward (relative to the central axis 74) into the mounting opening 26 of the mount 18.

The isolator 16 is incorporated within the mount 18 of the electronic device 12. Specifically, the isolator 16 is received into the mounting opening 26 of the mount 18, as shown in FIG. 6. The thickness $T_1$ of the elastomeric bushing 38 and the thickness T of the isolator 16 extend along the central axis 74 of the mount 18. When received within the mounting opening 26, the flange 80 of the mount 18 is received (i.e., captured) within the groove 64 of the elastomeric bushing 38 of the isolator 16, which may facilitate retaining the isolator 16 within the mounting opening 26. Alternatively, the mount 18 includes a groove (not shown) that receives a flange (not shown) of the elastomeric bushing 38 of the isolator 16.

The elastomeric bushing 38 is engaged with the mount 18 such that shock and/or vibrational forces are configured to be transmitted from the structure 20 to the electronic device 12 through the elastomeric bushing 12. The elastomeric bushing 38 is thereby configured to attenuate shock and/or vibrational forces transmitted from the structure 20 to the electronic device 12 when the electronic device 12 is mounted to the structure 20 using the isolator 16. In the exemplary embodiment, the reception of the flange 80 within the groove 64 engages the elastomeric bushing 38 with the mount 18 such that shock and/or vibrational forces are configured to be transmitted from the structure 20 to the electronic device 12 through the elastomeric bushing 12. But, other arrangements may be provided that enable shock and/or vibrational forces to be transmitted from the structure 20 to the electronic device 12 through the elastomeric bushing 12. For example, a flange (not shown) of the elastomeric bushing 38 at the end 58 may be engaged between the flange 46 of the bobbin 36 and the mounting side 76 of the mount 18; and/or a flange (not shown) of the elastomeric bushing 38 at the end 60 may be engaged between the flange 48 of the bobbin 36 and the side 78 of the mount 18. Moreover, and for example, a flange (not shown) of the elastomeric bushing 38 at the end 58 may be engaged between the structure 20 and the mounting side 76 of the mount 18.

As can be seen in FIG. 6, the isolator 16 is incorporated within the mount 18 such that a majority of the overall thickness T of the isolator 16 extends within the height H of the mount 18 and such that a majority of the thickness $T_1$ of the elastomeric bushing 38 extends within the height H of the mount 18. In the exemplary embodiment, the structure end 32 of the isolator 16 extends outward from the mounting side 76 of the mount 18 such that the structure end 32 extends outside of the height H of the mount 18. Specifically, the flange 46 of the bobbin 36 and the end 58 of the elastomeric bushing 38 extend outside the height H of the mount 18. Although shown as overlapping the mounting side 76, in other embodiments the flange 46 and/or the end 58 does not overlap the mounting side 76. Any overlap of the mounting side 76 may facilitating limiting an amount of travel, compression, and/or the like of the elastomeric bushing 38, for example to facilitate preventing damage to the elastomeric bushing 38. In the exemplary embodiment, the end 34 of the isolator 16 extends outward from the side 78 of the mount 18 such that the end 34 extends outside of the height H of the mount 18. The flange 48 of the bobbin 36 and the end 60 of the elastomeric bushing 38 extend outside of the height H of the mount 18. Although shown as overlapping the side 78, in other embodiments the flange 48 and/or the end 60 does not overlap the side 78. Any overlap of the side 78 may facilitating limiting an amount of travel, compression, and/or the like of the elastomeric bushing 38, for example to facilitate preventing damage to the elastomeric bushing 38.

Although shown as a majority, any amount of the overall thickness T of the isolator 16 and any amount of the thickness $T_1$ of the elastomeric bushing 38 may extend within the height H of the mount 18. In some embodiments, an approximate entirety of the overall thickness T of the isolator 16 extends within the height H of the mount 18. Moreover, in some embodiments, an approximate entirety of the thickness $T_1$ of the elastomeric bushing 38 extends within the height H of the mount 18 (whether or not the approximate entirety of the overall thickness T of the isolator 16 extends within the height H of the mount 18).

The structure end 32 of the isolator 16 may extend outward from the mounting side 76 of the mount 18 by any amount that enables the isolator 16 to disengage the mounting side 76 from the structure 20 such that shock and/or vibrational forces are transmitted from the structure 20 to the electronic device 12 through the isolator 16. In other words, the structure end 32 of the isolator 16 may be offset from the mounting side 76 of the mount 18 in the direction of the arrow A by any amount. In the exemplary embodiment, a minority of the thickness T of the isolator 16 extends outward from the mounting side 76 of the mount 18. In some embodiments, the isolator 16 does not extend outward from the mounting side 76 to disengage the mounting side 76 from the structure 20, but rather the structure end 32 of the isolator 16 is recessed into the mounting opening 26 in the direction of the arrow B and the structure end 32 engages a protrusion (not shown) of the structure 20 that extends into the mounting opening 26. In still other embodiments, the structure end 32 of the isolator 16 is approximately aligned (i.e., flush) with the mounting side 76 of the mount 18. The amount that the structure end 32 of the isolator 16 extends outward from the mounting side 76 of the mount 18 may affect how much height, if any, is added to the electronic device 12 by the isolator 16.

The end 34 of the isolator 16 may extend outward from the side 78 of the mount 18 by any amount. In some embodiments, the isolator 16 does not extend outward from the side 78, but rather the end 34 of the isolator 16 is recessed into the mounting opening 26 in the direction of the arrow A or is approximately aligned (i.e., flush) with the side 78 of the mount 18.

In the exemplary embodiment, the isolator 16 is incorporated within the mount 18 such that the isolator 16 extends along an approximate entirety of the height H of the mounting opening 26. Moreover, the isolator 16 is incorporated within the mount 18 such that elastomeric bushing 38 of the isolator 16 extends along an approximate entirety of the height H of the mounting opening 26 in the exemplary embodiment. But, the isolator 16 and the elastomeric bushing 38 may each extend along any amount of the height H of the mounting opening 26. For example, the isolator 16 and the elastomeric bushing 38 may each extend along a majority or a minority of the height H of the mounting opening 26.

Referring again to FIG. 1, the mount 18 has an outer perimeter P that is defined by an exterior surface 82 of the mount 18. In the exemplary embodiment, the isolator 16 is incorporated within the mount 18 such that an approximate entirety of the isolator 16 extends within the outer perimeter P of the mount 18. Accordingly, an approximate entirety of the elastomeric bushing 38 extends within the outer perimeter P of the mount 18. But, in other embodiments, one or more segments of the isolator 16 (e.g., a portion of the bobbin 36 and/or a portion of the elastomeric bushing 38) may extend outside the outer perimeter P of the mount 18.

FIG. 7 is a cross-sectional view of the electronic device assembly 10 illustrating the electronic device 12 mounted to the structure 20 using an isolation system 14. The electronic device 12 may be mounted to the structure 20 using any number of isolation systems 14. For example, the electronic device 12 may include any number of mounts 18, and an isolation system 14 may be used with any number of the mounts 18 of the electronic device 12.

The electronic device 12 is mounted to the structure 12 using the isolation system 14 such that the elastomeric bushing 38 of the isolator 16 is mounted between the electronic device 12 and the structure 20. By "mounted between" the electronic device 12 and the structure 20, it is meant that the elastomeric bushing 38 is engaged with the mount 18 such that the elastomeric bushing 38 is configured to attenuate shock and/or vibrational forces transmitted from the structure 20 to the electronic device 12. Specifically, the isolator 16 is incorporated within the mount 18 such that the flange 80 of the mount 18 is engaged with the elastomeric bushing 38 within the groove 64. The structure end 32 of the isolator 16 of the isolation system 14 is engaged with a surface 84 of the structure 20. In the exemplary embodiment, the structure side 50 of the flange 46 of the bobbin 36 is engaged with the surface 84 of the structure 20. The bobbin 36 may thereby be considered to be "hard mounted" to the structure 20. As can be seen in FIG. 7, the mounting side 76 of the mount 18 is spaced apart from the surface 84 of the structure 20 by a gap G such that the mounting side 76 is disengaged from the structure 20. The mounting hardware 28 is received through the mounting opening 26 of the mount 18 and through the central opening 44 of the bobbin 36. The isolator 16 is captured between a head 86 of the mounting hardware 28 and the surface 84 of the structure 20. The mounting hardware 28 includes a thread 88. An end 90 of the mounting hardware 28 extends into an opening 92 of the structure 20 such that the thread 88 is threadably connected to a nut (not shown) and/or a thread (not shown) of the opening 92. The mounting hardware 28 thereby retains the mount 18 of the electronic device 12 to the structure 20.

Accordingly, the mount 18 of the electronic device 12 is mounted to the structure 20 using the isolator 16 such that the elastomeric bushing 38 is mounted between the electronic device 12 and the structure 20. Shock and/or vibrational forces generated by the structure 20 are transmitted from the surface 84 of the structure 20 to the bobbin 36. In the exemplary embodiment, the engagement between the mount flange 80 and the elastomeric bushing 38 transmits the shock and/or vibrational forces from the bobbin 36 to the mount 18 through the elastomeric bushing 38. The elastomeric bushing 38 thereby attenuates shock and/or vibrational forces transmitted from the structure 20 to the electronic device 12. The elastomeric bushing 38 is optionally compressed between the flanges 46 and 48 of the bobbin 36 to give the elastomeric bushing 38 a predetermined amount of preload.

As described above specifically with respect to the elastomeric bushing 38, various parameters of the isolator 16 may be selected to tune the natural frequency of the elastomeric bushing 38 to a predetermined value, which may be selected to configure the elastomeric bushing 38 to attenuate frequencies at and/or greater than a predetermined value. Examples of the various parameters that may be selected to tune the natural frequency of the elastomeric bushing 38 include, but are not limited to, the material(s), size, shape, geometry, mass, and/or the like of the bobbin 36, the material(s), size, shape, geometry, preload, mass, and/or the like of the elastomeric bushing 38, the size, shape, geometry, and/or the like of the mounting opening 26, the overall size, shape, geometry, mass, and/or the like of the isolator 16, and/or the like. Examples of the value of the natural frequency of the elastomeric bushing 38 include, but are not limited to, the exemplary values described above. Examples of frequencies that the elastomeric bushing 38 is configured to attenuate include, but are not limited to, the exemplary values described above. The isolator 16 may be configured to attenuate the frequencies experienced by any component(s) of the electronic device 12. For example, the natural frequency of the elastomeric bushing 38 may be tuned to configure the elastomeric bushing 38 to attenuate frequencies experienced by a particular electronic sub-device 22, frequencies experienced by a housing and/or a cover of the electronic device 12, frequencies experienced by a housing and/or a cover of an electronic sub-device 22, frequencies experienced by a circuit board of the electronic device 12, frequencies experienced by a circuit board of an electronic sub-device 22, frequencies experienced by a contactor and/or a current carrying contact of the electronic device 12, frequencies experienced by a circuit card assembly of the electronic device 12, frequencies experienced by a switch of the electronic device 12, frequencies experienced by an auxiliary position sensor and/or switch of the electronic device 12, and/or the like.

The isolation system 14 may reduce the height of the electronic device assembly 10 as compared to known isolation systems. For example, because the isolator 16 is incorporated within the mount 18 of the electronic device 12, the isolator 16 extends a lesser distance, if any, outward from the mounting side 76 of the mount 18 as compared to known isolators that are engaged between the mounting side of the mount and the structure. The isolator 16 thereby adds less height to the electronic device 12. Such a reduction in height may enable the electronic device assembly 10 to be used in a relatively confined space. Moreover, such a reduction in height may enable the electronic device 12 to be used in applications for which the electronic device 12 was previously not suitable. For example, some electronic devices may not be suitable for use in particular environments without including one or more isolators because shock and/or vibrational forces would cause the electronic device to fail, malfunction, be damaged, and/or the like. But, there may not be adequate space available to contain such an electronic device with known isolation systems. By reducing the height of the electronic device assembly 10 as compared to known isolation systems, the isolation system 14 may enable the electronic device 12 to be used within a relatively confined space with one or more of the isolators 16, thereby enabling the electronic device 12 to be used in an application for which the electronic device 12 was previously not suitable.

As described above specifically with respect to the elastomeric bushing 38, various parameters of the isolator 16 may be selected such that the isolator 16, in cooperation with the mount 18, is configured to support a predetermined amount of weight. Examples of the various parameters that may be selected to enable the isolator 16, in cooperation with the mount 18, to support a predetermined amount of weight include, but are not limited to, the material(s), size, shape, geometry, mass, and/or the like of the bobbin 36, the material(s), size, shape, geometry, preload, mass, and/or the like of the elastomeric bushing 38, the size, shape, geometry, and/or the like of the mount flange 80 and/or the groove 64, the material(s), size, shape, geometry, mass, and/or the like of the mount 18, the overall size, shape, geometry, mass, and/or the like of the isolator 16, and/or the like. Examples of the value of the weight that the isolator 16, in cooperation with the mount 18, is configured to support include, but are not limited to, the exemplary values described above.

The isolation system 14 may be configured to support a greater amount of weight than known isolation systems. For example, fabricating the elastomeric bushing 58 from Viton® may enable an isolator 16 to support more weight (while maintaining the attenuation capabilities thereof) as compared to known isolators having elastomeric bushings fabricated from silicone and/or rubber. Such an increase in the amount of weight that can be supported by the isolation system 14 may enable the electronic device 12 to be used in applications for which the electronic device 12 was previously not suitable. For example, as described above some electronic devices may not be suitable for use in particular environments without including one or more isolators because shock and/or vibrational forces would cause the electronic device to fail, malfunction, be damaged, and/or the like. But, such electronic devices may be too heavy to be supported by known isolations systems. By increasing the weight capacity of the isolation system 14 as compared to known isolation systems, the isolation system 14 may enable a relatively heavy electronic device 12 to be used in an application for which the electronic device 12 was previously not suitable.

Other arrangements and/or types of mounting hardware 28 may be used in addition or alternative to the threaded bolt shown and described herein, such as, but not limited to, a rivet, another type of threaded fastener, and/or the like. Moreover, the isolator 16 optionally includes one or more captive hardware features. For example, the exemplary embodiment of the isolator 16 shown in FIG. 7 includes an internal thread 94 that extends within the bobbin 36 along at least one or more segments of the central opening 44. The internal thread 94 of the bobbin 36 threadably connects to a thread 96 of the mounting hardware 28 to mechanically connect (i.e., retain) the mounting hardware 28 to the isolator 16. The thread 96 of the mounting hardware 28 may alternatively be a continuation of the thread 88. Other types of captive hardware features may be used in addition or alternative to the threads 84, 96, and/or 88. For example, the mounting hardware 28 may include a groove (not shown) that interlocks with a retaining ring (not shown) that extends around the mounting hardware 28 (e.g., a Magic Groove® fastener commercially available from Fastener Technology Corp. of North Hollywood, Calif.).

Referring again to FIG. 1, the electronic device 12 is optionally electrically connected to the structure 20. In such embodiments, at least a portion of the structure 20 and at least a portion of the electronic device 12 (e.g., the chassis 24 and/or the like) is electrically conductive. Alternatively, the structure 20 and/or the electronic device 12 (e.g., the chassis 24 and/or the like) does not include any electrically conductive portions that electrically connect to each other. As briefly described above, the isolator 16 optionally provides a segment 98b (shown in FIG. 7) of an electrical path 98 between the electronic device 12 and the structure 20. In the exemplary embodiment, the bobbin 36 is electrically conductive and provides the segment 98b of the electrical path 98, as will be described below. The electrical path 98 between the electronic device 12 and the structure 20 may have any function, application, and/or the like, such as, but not limited to, an electrical ground path for electrically connecting the electronic device 12 to an electrical ground, a direct current (DC) bonding path between the electronic device 12 and the structure 20, shedding lightning induced current, providing a path for fault current due to malfunction, and/or the like.

The isolation system 14 may include a flexible electrical conductor 100 that completes the electrical path 98 between the electronic device 12 and the structure 20 that is provided in part by the isolator 16. As used herein, the term "flexible" as applied to the conductor 100 is intended to mean that the conductor 100 has sufficient flexibility to accommodate relative movement between the isolator 16 and the location on the electronic device 12 where the flexible conductor 100 is mechanically connected, for example during attenuation of shock and/or vibrational forces by the isolator 16. The flexible conductor 100 extends a length from a device end 102 to an opposite isolator end 104.

The device end 102 is mounted to the electronic device 12 such that the flexible conductor 100 is mechanically and electrically connected to the electronic device 12 at the device end 102. In the exemplary embodiment, the device end 102 is mounted to the electronic device 12 using a threaded fastener 106 such that the device end 102 engages the electronic device 12 in electrical connection therewith. But, other types of mounting hardware and/or other electrical connection arrangements may additionally or alternatively be provided. Examples of other types of mounting hardware that may be used in addition or alternative to the threaded fastener 106 include, but are not limited to, a rivet, another type of threaded fastener, a clamp, a clip a tie, an electrically conductive bonding agent, and/or the like. Although shown as being mounted to the chassis 24 of the electronic device 12, the device end 102 of the flexible conductor 100 may additionally or alternatively be electrically and mechanically connected to any other location and/or component of the electronic device 12, such as, but not limited to, a particular electronic sub-device 22, a housing and/or a cover of the electronic device 12, a housing and/or a cover of an electronic sub-device 22, a circuit board of the electronic device 12, a circuit board of an electronic sub-device 22, a contactor and/or a current carrying contact of the electronic device 12, a switch of the electronic device 12, an auxiliary position sensor and/or switch of the electronic device 12, and/or the like.

Figure 8:
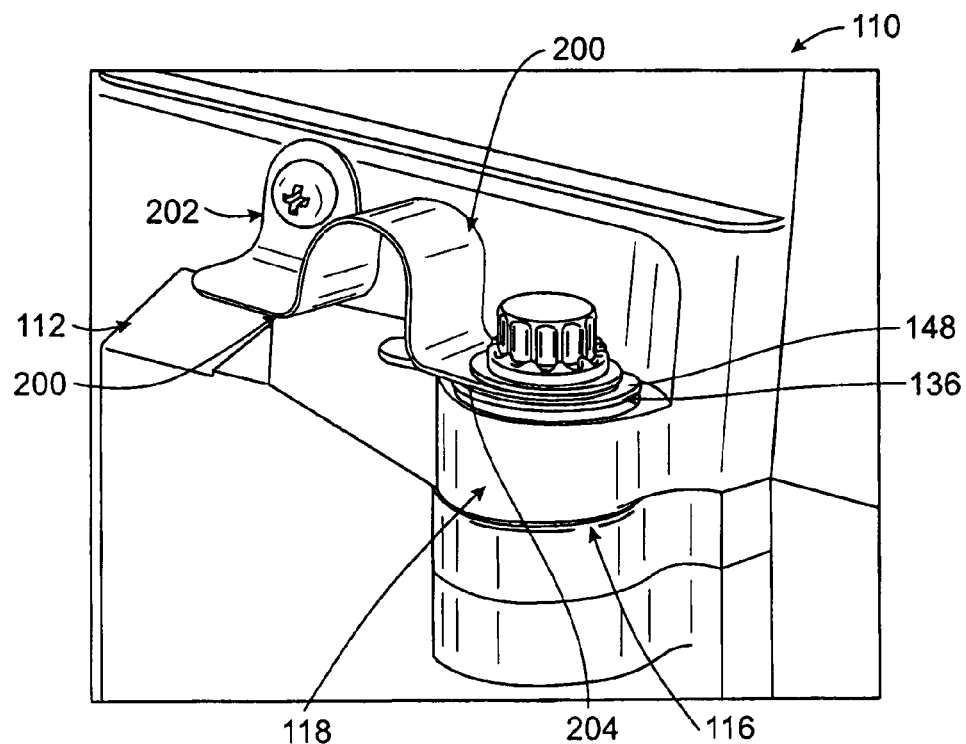
FIG. 8 is a perspective view of a portion of another embodiment of an electronic device assembly.

The isolator end 104 of the flexible conductor 100 is mounted to the isolator 16 such that the flexible conductor 100 is mechanically and electrically connected to the isolator 16. Specifically, the isolator end 104 of the is mechanically and electrically connected to the bobbin 36 of the isolator 16. Referring now to FIG. 7, in the exemplary embodiment, the isolator end 104 of the flexible conductor 100 is mounted to the bobbin 36 using the mounting hardware 28 such that the isolator end 104 is electrically connected to the bobbin 36. Moreover, an optional washer 108 is engaged between the isolator end 104 of the flexible conductor 100 and the side 54 of the flange 48 of the bobbin 36. The washer 108 is electrically conductive such that the isolator end 104 of the flexible conductor 100 is electrically connected to the flange 48 of the bobbin 36 through the washer 108. In addition or alternatively, the isolator end 104 of the flexible conductor 100 engages (i.e., physically contacts) the side 54 of the flange 48 to electrically connect the flexible conductor 100 to the bobbin 36. For example, FIG. 8 is a perspective view of a portion of another embodiment of an electronic device assembly 110 having a flexible conductor 200 that extends a length from a device end 202 to isolator end 204. The device end 202 is mechanically and electrically connected to an electronic device 112. The isolator end 204 is engaged with a flange 148 of a bobbin 136 of an isolator 116. The flexible conductor 200 thereby provides an electrical path from the electronic device 112 to the bobbin 136 of the isolator 116. The bobbin 36 provides an electrical path from the flexible conductor 200 through a mount 118 of the electronic device 112 to a structure (not shown) to which the electronic device 112 is to be mounted, for example as described below with respect to the electrical path 98b (shown in FIG. 7) provided by the bobbin 36 (shown in FIGS. 1 and 3-7).

Referring again to FIG. 1, other types of mounting hardware and/or other electrical connection arrangements may additionally or alternatively be provided. Examples of other types of mounting hardware that may be used in addition or alternative to the mounting hardware 28 include, but are not limited to, a rivet, another type of threaded fastener, a clamp, a clip a tie, an electrically conductive bonding agent, and/or the like.

The electrical path 98 from the electronic device 12 to the structure 20 includes a segment 98a provided by the flexible conductor 100 and the segment 98b provided by the isolator 16. Specifically, the segment 98a of the electrical path 98 extends from the electronic device 12 to the device end 102 of the flexible conductor 100, through the length of the flexible conductor 100 to the isolator end 104 of the flexible conductor 100, and to the flange 48 of the bobbin 36.

Referring now to FIG. 7, the bobbin 36 is electrically connected to the structure 20 via engagement of the flange 46 of the bobbin 36 with the surface 84 of the structure 20. In other words, in the exemplary embodiment, the hard mounting of the bobbin 36 to the structure 20 provides the electrical connection between the bobbin 36 and the structure 20. In addition or alternatively, the flange 46 of the bobbin 36 may be electrically connected to the structure 20 through one or more intervening structures, such as, but not limited to, an electrically conductive washer, an electrically conductive bonding agent, and/or the like. The segment 98b of the electrical path 98 extends from the flange 48 of the bobbin 36, through the bobbin 36 to the flange 46 of the bobbin 36, and to the structure 20, as shown in FIG. 7. Accordingly, as can be seen in FIGS. 1 and 7, the electrical path 98 extends from the electronic device 12, through the flexible conductor 100, through the bobbin 36, and to the structure 20.

Referring now solely to FIG. 1, the isolator 16 is coupled between the electronic device 12 and the structure 20 within the mount 18 such that an approximate entirety of the electrical path segment 98b provided by the isolator 16 extends through the mount 18. Accordingly, an approximate entirety of the electrical path segment 98b provided by the isolator 16 extends within the outer perimeter P of the mount 18, and thereby within an outer perimeter P of the electronic device 12.

The extension of the electrical path segment 98b through the isolator 16 may reduce the size of the electronic device assembly 10 as compared to known electronic device assemblies. For example, because the electrical path segment 98b extends through the mount 18 (i.e., within the outer perimeter P of the mount 18) instead of along a conductor (not shown) that extends outside the outer perimeter P of the mount 18, the electronic device assembly 10 may be smaller than at least some known electronic device assemblies. Such a reduction in size may enable the electronic device assembly 10 to be used in a relatively confined space. Moreover, such a reduction in size may enable the electronic device 12 to be used in applications for which the electronic device 12 was previously not suitable. For example, providing the electrical path segment 98b through the mount 18 may enable the electronic device 12 to be used within a relatively confined space while still being electrically connected to the structure 20. Further, providing the electrical path segment 98b through the mount 18 may prevent the electrical connection between the electronic device 12 and the structure 20 from electrically shorting and/or being damaged from contact with neighboring objects such as, but not limited to, neighboring devices, structures, components, and/or the like.

The flexible conductor 100 may be fabricated from any material(s), such as, but not limited to, a metal, steel, iron, stainless steel, copper, aluminum, chromate, nickel, beryllium, and/or the like. Examples of the material construction of the flexible conductor 100 include, but are not limited to, a beryllium copper structure that is finished with aluminum and/or chromate, a copper or beryllium copper structure that is electro or electro-less nickel plated, a stainless steel structure that is electro or electro-less nickel plated, and/or the like. The material(s), size, shape, geometry, and/or the like of the flexible conductor 100 may be selected to provide the flexible conductor 100 with a predetermined electrical resistance. The material(s), size, shape, geometry, and/or the like of the bobbin 36 and/or the isolator 16 overall may be selected to provide the bobbin 36 and/or the isolator 16 overall with a predetermined electrical resistance. The predetermined electrical resistance of each of the flexible conductor 100, the bobbin 36, and the isolator may have any value, such as, but not limited to, less than approximately 2.5 milliohms, less than approximately 2.0 milliohms, less than approximately 1.5 milliohms, less than approximately 1.0 milliohms, and/or the like. Providing the bobbin 36 and/or the isolator 16 overall with a predetermined electrical resistance that is below a predetermined value may enable the electrical path 98 to extend through the isolator 16 while still complying with an upper resistance limit of a particular application.

It should be understood that during operation of the isolator 16 (e.g., during attenuation of shock and/or vibrational forces), the electronic device 12 and the isolator 16 may move relative to each other. For example, the location of the electronic device 12 where the device end 102 of the flexible conductor 100 is mounted may move relative to the location of the isolator 16 where the isolator end 104 of the flexible conductor 100 is mounted. The flexible conductor 100 is sufficiently flexible to accommodate such relative movement between the electronic device 12 and the isolator 16. The flexible conductor 100 may be sufficiently flexible to accommodate any amount of relative movement between the electronic device 12 and the isolator 16, such as, but not limited to, relative movement between approximately 0.010 inches and approximately 0.200 inches, between approximately 0.030 inches and approximately 0.070 inches, between approximately 0.090 inches and approximately 0.130 inches, and/or the like.

Figure 9:
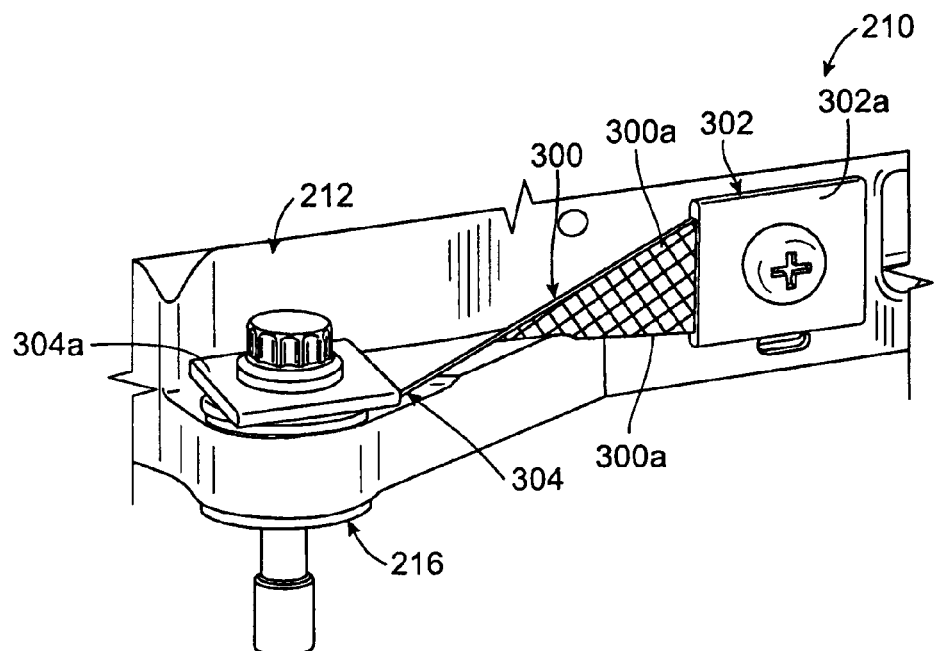
FIG. 9 is a perspective view of a portion of another embodiment of an electronic device assembly.

In the exemplary embodiment, the flexible conductor 100 is an approximately planar strap. But, the flexible conductor 100 may additionally or alternatively include any other structure, construction, size, shape, geometry, and/or the like that enables the flexible conductor 100 to function as described and/or illustrated herein, such as, but not limited to, a braid, a wire, a cable, and/or the like. For example, FIG. 9 is a perspective view of a portion of another exemplary embodiment of an electronic device assembly 210. The electronic device assembly 210 includes a flexible conductor 300 that extends a length from a device end 302 to an isolator end 304. The flexible conductor 300 is a conductive braid. Specifically, the flexible conductor 300 has the construction of a plurality of electrical conductors 300a that are braided together. The braid of the flexible conductor 300 may have any construction and may be fabricated from any material(s), such as, but not limited to, the examples described above with respect to the flexible conductor 100 (shown in FIGS. 1 and 7). Examples of the material construction of each of the braided conductors 300a include, but are not limited to, stainless steel conductors that are electro or electro-less nickel plated, copper conductors that are electro or electro-less nickel plated, and/or the like. One example of a commercially available conductive braid is ArmorLite™ Lightweight Microfilament Stainless Steel EMI/RFI Braid, commercially available from Glenair, Inc. of Glendale Calif. Any other suitable conductive braid that enables the flexible conductor 300 to function as described and/or illustrated herein may be used.

In the exemplary embodiment, the device end 302 and the isolator end 304 of the flexible conductor 300 are mounted to an electronic device 212 and an isolator 216, respectively, of the assembly 10 using respective lugs 302a and 304a. The lugs 302a and 304a may each be fabricated from any material(s), such as, but not limited to, a metal, steel, iron, stainless steel, copper, aluminum, chromate, nickel, beryllium, and/or the like. Examples of the material construction of the lugs 302a and/or 304a include, but are not limited to, a beryllium copper structure that is finished with aluminum and/or chromate, a copper or beryllium copper structure that is electro or electro-less nickel plated, a stainless steel structure that is electro or electro-less nickel plated, and/or the like. The material(s), size, shape, geometry, and/or the like of the lugs 302a and 304a may be selected to provide the lugs 302a and 304a with a predetermined electrical resistance.

The embodiments described and/or illustrated herein may provide an isolation system that is less costly than at least some known isolation systems. The embodiments described and/or illustrated herein may provide an electronic device assembly that is smaller than at least some known electronic device assemblies and can thereby fit within a relatively confined space within which at least some known electronic device assemblies do not fit. The embodiments described and/or illustrated herein may provide an isolation system that reduces the height of an electronic device assembly as compared to at least some known isolation systems. The embodiments described and/or illustrated herein may provide an electrical connection between and electronic device and a structure to which the electronic device is mounted that reduces the size of an electronic device assembly as compared to at least some known electronic device assemblies.

It is to be understood that the above description is intended to be illustrative, and not restrictive. For example, the above-described embodiments (and/or aspects thereof) may be used in combination with each other. Moreover, two or more of the above-described embodiments (and/or two or more aspects thereof) may be used separately from each other. In addition, many modifications may be made to adapt a particular situation or material to the teachings of the subject matter described and/or illustrated herein without departing from its scope. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the above description and the drawings. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electronic device assembly comprising:
an electronic device having a mount that includes a mounting opening defined by an interior surface of the mount, the mounting opening being configured to receive mounting hardware therein for mounting the electronic device to a structure, the mount including a flange that extends radially inward from the interior surface into the mounting opening; and
an isolator coupled to the mount, the isolator comprising an elastomeric bushing configured to attenuate at least one of shock or vibration exerted on the electronic device, the elastomeric bushing being composed of a fluoro rubber designated as FKM under the ASTM D1418 standard, the elastomeric bushing having an exterior side that defines an outer periphery of the elastomeric bushing, the elastomeric bushing defining a groove that extends radially inward from the exterior side around the outer periphery of the elastomeric bushing, wherein the isolator is incorporated within the mount such that the elastomeric bushing is received into the mounting opening of the mount, the flange of the mount being received within the groove of the elastomeric bushing, the elastomeric bushing within the mounting opening of the mount having a natural frequency of approximately 100 Hz wherein the isolator further comprises a bobbin having a central shaft that extends a distance along a central axis between two bobbin flanges, the elastomeric bushing extending around the central shaft of the bobbin axially between the two bobbin flanges, the elastomeric bushing engaging an elastomer side of each of the bobbin flanges and being compressed between the bobbin flanges, the elastomer side of one of the bobbin flanges extending at an acute angle relative to the central axis, the elastomer side of the other bobbin flange extending at an obtuse angle relative to the central axis, wherein the bobbin is defined by a first bobbin member and a second bobbin member, the first and second bobbin members each including a different one of the bobbin flanges and a corresponding portion of the central shaft, the first and second bobbin members coupled together using at least one of a press-fit, a bonding agent, or threads.

2. The assembly of claim 1, wherein the mount of the electronic device extends a height along a central axis from a mounting side to an opposite side, the mounting side of the mount facing the structure when the electronic device is mounted to the structure, the elastomeric bushing extending a thickness along the central axis of the mount, the elastomeric bushing being received into the mounting opening of the mount such that a majority of the thickness of the elastomeric bushing is disposed between the mounting side and the opposite side of the mount.

3. The assembly of claim 1, wherein the mount has an outer perimeter defined by an exterior surface of the mount, the elastomeric bushing incorporated within the mount such that an approximate entirety of the elastomeric bushing extends within the outer perimeter of the mount.

4. The assembly of claim 1, wherein the isolator further comprises a bobbin, the elastomeric bushing includes a central opening, and the elastomeric bushing extends around the bobbin such that the bobbin is received into the central opening of the elastomeric bushing.

5. The assembly of claim 1, wherein the elastomeric bushing comprises a first elastomeric member and a second elastomeric member that is discrete from the first elastomeric member, the first and second elastomeric members engaging each other to define the elastomeric bushing.

6. The assembly of claim 1, wherein the isolator further comprises a bobbin, the elastomeric bushing extending around the bobbin, the bobbin being configured to be hard mounted to the structure.

7. The assembly of claim 1, wherein the isolator system further comprises a bobbin, the elastomeric bushing extending around the bobbin, the bobbin comprising a thread for threadably connecting to the mounting hardware when the mounting hardware is received into the mounting opening of the mount.

8. The assembly of claim 1, wherein the elastomeric bushing is configured to attenuate frequencies of at least approximately 140 Hz.

9. An isolator for an electronic device having a mount for mounting the electronic device to a structure, the isolator comprising:

a bobbin defining a central opening for receiving mounting hardware therein for mounting the electronic device to the structure, the bobbin including a first bobbin member and a second bobbin member that are electrically conductive and discrete from each other, the first and second bobbin members each having a respective flange and a respective shaft segment extending from the flange, ends of the shaft segments of the first and second bobbin members engaging each other and being coupled together to define a central shaft that extends continuously along a central axis for a distance between the flanges of the first and second bobbin members, the first and second bobbin members coupled together using at least one of a press-fit, a bonding agent, or threads; and an elastomeric bushing mounted on the bobbin such that the elastomeric bushing extends around the central shaft of the bobbin axially between the flanges of the first and second bobbin members, the elastomeric bushing being composed of a fluoro rubber designated as FKM under the ASTM D1418 standard, the elastomeric bushing being configured to be engaged with the mount of the electronic device such that the elastomeric bushing is configured to attenuate at least one of shock or vibration exerted on the electronic device, the elastomeric bushing having a natural frequency between approximately 85 Hz and approximately 105 Hz, wherein the elastomeric bushing is compressed between the flanges when the shaft segments of the first and second bobbin members are coupled together, the distance between the flanges of the first and second bobbin members being selected to achieve a target amount of preload in the elastomeric bushing to support the electronic device having a predetermined amount of weight between approximately three and seven pounds wherein the elastomeric bushing engages an elastomer side of each of the flanges of the first and second bobbin members and is compressed between the flanges, the elastomer side of the flange of the first bobbin member extending at an acute angle relative to the central axis, the elastomer side of the flange of the second bobbin member extending at an obtuse angle relative to the central axis.

10. An electronic device assembly comprising:

an electronic device having a mount for mounting the electronic device to a structure, the mount extending a height along a central axis from a mounting side to an opposite side, the mount defining a mounting opening through the mount between the mounting side and the opposite side; and an isolator coupled to the mount, the isolator comprising:

a bobbin extending along a central shaft from a structure end to an opposite end, the bobbin having a central shaft that extends a distance along a central axis between two bobbin flanges, the bobbin defined by a first bobbin member and a second bobbin member, the first and second bobbin members each including a different one of the bobbin flanges and a corresponding portion of the central shaft, the first and second bobbin members coupled together using at least one of a press-fit, a bonding agent, or threads; and an elastomeric bushing mounted on the bobbin such that the elastomeric bushing extends around the central shaft axially between the two bobbin flanges, the elastomeric bushing being composed of a fluoro rubber designated as FKM under the ASTM D1418 standard, the elastomeric bushing engaging an elastomer side of each of the bobbin flanges and being compressed between the bobbin flanges, the elastomeric bushing engaging an elastomer side of each of the bobbin flanges and being compressed between the bobbin flanges, the elastomer side of one of the bobbin flanges extending at an acute angle relative to the central axis, the elastomer side of the other bobbin flange extending at an obtuse angle relative to the central axis, the elastomeric bushing configured to be engaged with the mount of the electronic device such that the elastomeric bushing is configured to attenuate at least one of shock or vibration exerted on the electronic device, the elastomeric bushing including a first elastomeric member and a second elastomeric member that are discrete from each other, the first and second elastomeric members both extending into the mounting opening of the mount and engaging each other within the mounting opening between the mounting side and the opposite side to define the elastomeric bushing, the elastomeric bushing being compressed between the structure end and the opposite end of the bobbin such that the elastomeric bushing has an internal amount of preload that provides the elastomeric bushing with a natural frequency between approximately 85 Hz and approximately 105 Hz.

11. The electronic device assembly of claim 10, wherein the elastomeric bushing is configured to attenuate frequencies of at least approximately 140 Hz.

12. The electronic device assembly of claim 10, wherein the mounting opening is configured to receive a mounting hardware therein for mounting the electronic device to the structure, the mounting hardware including a head outside of the mounting opening, the structure end of the bobbin configured to directly engage the structure, the opposite end of the bobbin facing and at least one of directly or indirectly engaging the head of the mounting hardware that is received within the mounting opening.

13. The electronic device assembly of claim 10, wherein the mounting opening of the mount is defined by an interior surface of the mount, the mount including a flange that extends radially inward into the mounting opening from the interior surface, the elastomeric bushing defining a groove that extends radially inward from an exterior side of the elastomeric bushing that defines an outer periphery of the elastomeric bushing, the elastomeric bushing being received into the mounting opening of the mount such that the flange of the mount is received within the groove of the elastomeric bushing.

14. The electronic device assembly of claim 13, wherein a first portion of the groove of the elastomeric bushing is defined by the first elastomeric member and a second portion of the groove is defined by the second elastomeric member.

15. The assembly of claim 1, wherein the fluoro rubber is composed of one or more copolymers selected from the group consisting of hexafluoropropylene (HFP), vinylidene fluoride (VDF), and tetrafluoroethylene (TFE).

16. The electronic device assembly of claim 1, wherein a distance between the elastomer sides of the bobbin flanges along the central axis increases with increasing radial distance from the central shaft.

17. The electronic device assembly of claim 10, wherein a distance between the elastomer sides of the bobbin flanges along the central axis increases with increasing radial distance from the central shaft.

* * * * *